United States Patent
Jones et al.

(10) Patent No.: US 10,203,411 B2
(45) Date of Patent: Feb. 12, 2019

(54) SYSTEM AND METHOD FOR REDUCING AMBIENT LIGHT SENSITIVITY OF INFRARED (IR) DETECTORS

(71) Applicant: Maxim Integrated Products, Inc., San Jose, CA (US)

(72) Inventors: Joy T. Jones, Fremont, CA (US); Nicole D. Kerness, Menlo Park, CA (US); Sunny K. Hsu, Los Altos, CA (US); Anand Chamakura, San Jose, CA (US); Christopher F. Edwards, Sunnyvale, CA (US); David Skurnik, Kirkland, WA (US); Phillip J. Benzel, Pleasanton, CA (US); Nevzat A. Kestelli, San Jose, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 14/067,445

(22) Filed: Oct. 30, 2013

(65) Prior Publication Data
US 2014/0124797 A1    May 8, 2014

Related U.S. Application Data

(60) Provisional application No. 61/722,063, filed on Nov. 2, 2012.

(51) Int. Cl.
*H01L 31/0232* (2014.01)
*H01L 31/09* (2006.01)
(Continued)

(52) U.S. Cl.
CPC .......... *G01S 17/026* (2013.01); *G01S 7/4811* (2013.01); *G06F 3/0304* (2013.01);
(Continued)

(58) Field of Classification Search
CPC .............. H01L 31/101; H01L 31/0232; H01L 27/14652; H01L 27/14669;
(Continued)

(56) References Cited

U.S. PATENT DOCUMENTS 6,198,147 B1 *   3/2001   Connolly ...................... 257/461
7,208,738 B2 *   4/2007   Yoganandan et al. ..... 250/354.1
(Continued)

FOREIGN PATENT DOCUMENTS

CN   101840950 A   9/2010
WO   2012059656 A1   5/2012

OTHER PUBLICATIONS

Office Action dated Jul. 3, 2017 for Chinese Appln. No. 201310756877.9.
(Continued)

*Primary Examiner* — Natalia Gondarenko
(74) *Attorney, Agent, or Firm* — Kevin E. West; Advent, LLP

(57) ABSTRACT

Aspects of the disclosure pertain to a system and method for reducing ambient light sensitivity of Infrared (IR) detectors. Optical filter(s) (e.g., absorption filter(s), interference filter(s)) placed over a sensor of the IR detector (e.g., gesture sensor) absorb or reflect visible light, while passing specific IR wavelengths, for promoting the reduced ambient light sensitivity of the IR detector.

18 Claims, 6 Drawing Sheets

(51) Int. Cl.
*H01L 31/167* (2006.01)
*H01L 31/173* (2006.01)
*G01S 17/02* (2006.01)
*G06F 3/03* (2006.01)
*H01L 31/0216* (2014.01)
*G01S 7/481* (2006.01)
*H01L 31/12* (2006.01)
*H01L 31/14* (2006.01)
*G01J 5/08* (2006.01)
*G01J 5/06* (2006.01)
*G01J 1/04* (2006.01)

(52) U.S. Cl.
CPC ...... *H01L 31/02162* (2013.01); *H01L 31/173* (2013.01); *G01J 1/0488* (2013.01); *G01J 5/06* (2013.01); *G01J 5/0862* (2013.01)

(58) Field of Classification Search
CPC ............. H01L 27/14694; H01L 27/153; H01L 27/14649; H01L 27/14621; H01L 27/14627; H01L 27/14685; H01L 27/146; H01L 31/00; H01L 31/0216; H01L 31/023; H01L 31/02162; H01L 31/173; H01L 27/14643–27/14663; H01L 31/107; H01L 27/14; H01L 27/144; H01L 27/1462; H01L 27/14625; H01L 27/14634; H01L 27/1467; H01L 27/1469; H01L 31/02164; H01L 31/02165; H01L 31/02327; H01L 31/125; H01L 31/14; H01L 31/147; H01L 31/153; H01L 31/16; H01L 31/162; H01L 31/167; H01L 27/15; H01L 25/115; H01L 25/167; G01S 17/026; G01S 7/4811; G06F 3/0304; G01J 1/0488; G01J 5/0862; G01J 1/06
USPC ... 257/80, 432, 461, 443, E31.102, E31.001, 257/82, 431, 464, E31.127, E33.077; 438/73, 25, 59; 250/226, 208.1, 208.2, 250/216
See application file for complete search history.

(56) References Cited

U.S. PATENT DOCUMENTS

| | | | |
|---|---|---|---|
| 7,803,647 B2 * | 9/2010 | Wang | H01L 27/14625 257/414 |
| 8,274,051 B1 * | 9/2012 | Aswell et al. | 250/339.05 |
| 8,461,513 B2 * | 6/2013 | Kroese | G01J 1/0488 250/208.2 |
| 8,637,907 B2 * | 1/2014 | Hebert | G06F 3/04883 257/233 |
| 8,749,007 B1 * | 6/2014 | Kerness et al. | 257/432 |
| 2003/0034491 A1 | 2/2003 | Lempkowski et al. | |
| 2004/0159774 A1 | 8/2004 | Mishina et al. | |
| 2004/0232430 A1 * | 11/2004 | Lempkowski | H01L 21/8221 257/80 |
| 2007/0152227 A1 | 7/2007 | Han | |
| 2008/0105944 A1 * | 5/2008 | Chang | H01L 21/761 257/461 |
| 2008/0135897 A1 * | 6/2008 | Huang et al. | 257/292 |
| 2009/0026563 A1 * | 1/2009 | Katsuno | H01L 27/14603 257/432 |
| 2009/0150160 A1 * | 6/2009 | Mozer | 704/275 |
| 2009/0295953 A1 * | 12/2009 | Nozaki | H01L 27/14627 348/294 |
| 2010/0102230 A1 | 4/2010 | Chang et al. | |
| 2010/0283133 A1 * | 11/2010 | Hamada | C08G 77/08 257/632 |
| 2011/0242350 A1 * | 10/2011 | Sawayama | H01L 27/14625 348/222.1 |
| 2012/0019904 A1 * | 1/2012 | Inoue | 359/350 |
| 2012/0138959 A1 * | 6/2012 | Tsang | H05B 33/0869 257/80 |
| 2012/0187280 A1 * | 7/2012 | Kerness et al. | 250/214.1 |
| 2012/0199930 A1 * | 8/2012 | Hayashi | H01L 27/1461 257/435 |
| 2012/0268574 A1 | 10/2012 | Gidon | |
| 2012/0319222 A1 * | 12/2012 | Ozawa | H01L 27/14605 257/432 |
| 2013/0037902 A1 * | 2/2013 | Nakazawa | H01L 27/14627 257/432 |
| 2013/0256822 A1 * | 10/2013 | Chen | H01L 27/14632 257/443 |

OTHER PUBLICATIONS

Office Action dated Mar. 30, 2018 for Chinese Appln. No. 201310756877.9.

Office Action in Chinese Patent Appln No. 201310756877.9, dated Oct. 15, 2018.

* cited by examiner

SYSTEM AND METHOD FOR REDUCING AMBIENT LIGHT SENSITIVITY OF INFRARED (IR) DETECTORS

CROSS-REFERENCE TO RELATED APPLICATIONS

This application claims priority to U.S. Provisional Application No. 61/722,063 filed on Nov. 2, 2012, entitled: "System and Method for Reducing Ambient Light Sensitivity of Infrared (IR) Detectors", which is hereby incorporated by reference in its entirety.

BACKGROUND

Electronic devices, such as smart phones, tablet computers, digital media players, and so forth, increasingly employ light sensors to control the manipulation of a variety of functions provided by the device. For example, light sensors are commonly used by electronic devices to detect ambient lighting conditions in order to control the brightness of the device's display screen. Typical light sensors employ photodetectors such as photodiodes, phototransistors, or the like, which convert received light into an electrical signal (e.g., a current or voltage).

Light sensors are commonly used in Infrared (IR)-based sensing devices, such as gesture sensing devices. Gesture sensing devices are devices which enable the detection of physical movement (e.g., "gestures") without the user actually touching the device within which the gesture sensing device resides. The detected movements can be subsequently used as input commands for the device. In implementations, the electronic device is programmed to recognize distinct non-contact hand motions, such as left-to-right, right-to-left, up-to-down, down-to-up, in-to-out, out-to-in, and so forth. Gesture sensing devices have found popular use in handheld electronic devices, such as tablet computing devices and smart phones, as well as other portable electronic devices, such as laptop computers, video game consoles, and so forth.

SUMMARY

An infrared detector system is disclosed. In one or more implementations, the infrared detector system includes a substrate, a sensor formed in the substrate, and an optical filter positioned over the sensor. The sensor is configured to detect light which is directed towards the sensor and to provide a signal in response thereto. The optical filter is configured for at least substantially preventing a visible content of the light directed towards the sensor from reaching the sensor. The optical filter is further configured for allowing a selected infrared content of the light directed towards the sensor to pass through the optical filter to the sensor.

A gesture detector system is disclosed. In one or more implementations, the gesture detector system includes a substrate, a gesture sensor formed in the substrate, a light-emitting diode (LED), and one or more absorption filters positioned over the gesture sensor. The gesture sensor is configured to detect light directed towards the gesture sensor and to provide a signal in response thereto. The light-emitting diode is configured for emitting infrared light for being directed towards the gesture sensor. The one or more absorption filters are configured for absorbing a visible content of the light directed towards the gesture sensor to at least substantially block the visible content of the light from reaching the gesture sensor. The one or more absorption filters are further configured for allowing a selected infrared content of the light directed towards the gesture sensor to pass through the at least one absorption filter to the gesture sensor. In one or more example embodiments, the gesture detector system is a single-LED gesture detector system.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

Figure 2A:
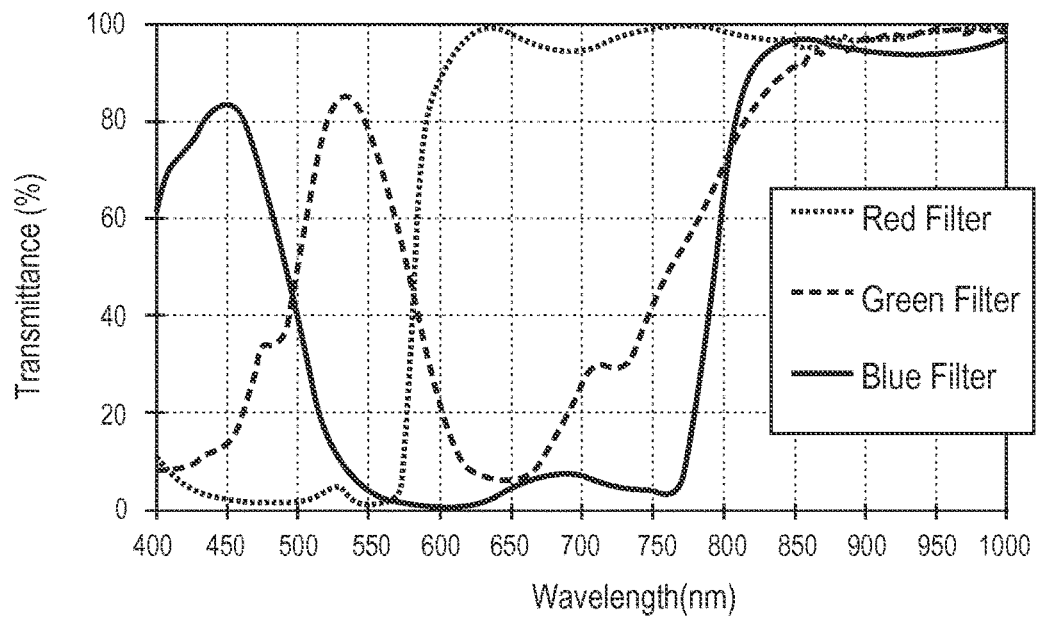
FIG. 2A is a graphical depiction of the transmittance performance (over a range of light wavelengths) of blue, green and red absorption filters when the filters are implemented individually (e.g., in a non-stacked manner) in an infrared detector system in accordance with an exemplary embodiment of the present disclosure.
Figure 2B:
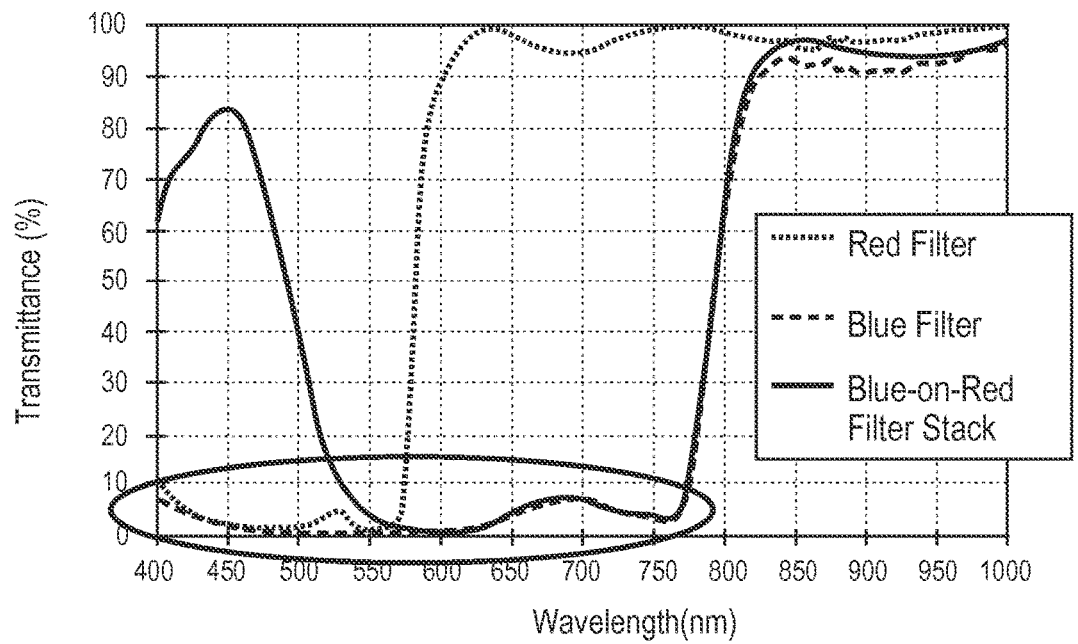

FIG. 2B is a graphical depiction of the transmittance performance (over a range of light wavelengths) of a blue-on-red absorption filter stack implemented in an infrared detector system, compared with the transmittance performance of blue and red absorption filters when the blue and red filters are implemented individually in an infrared detector system in accordance with an exemplary embodiment of the present disclosure.

Figure 2C:
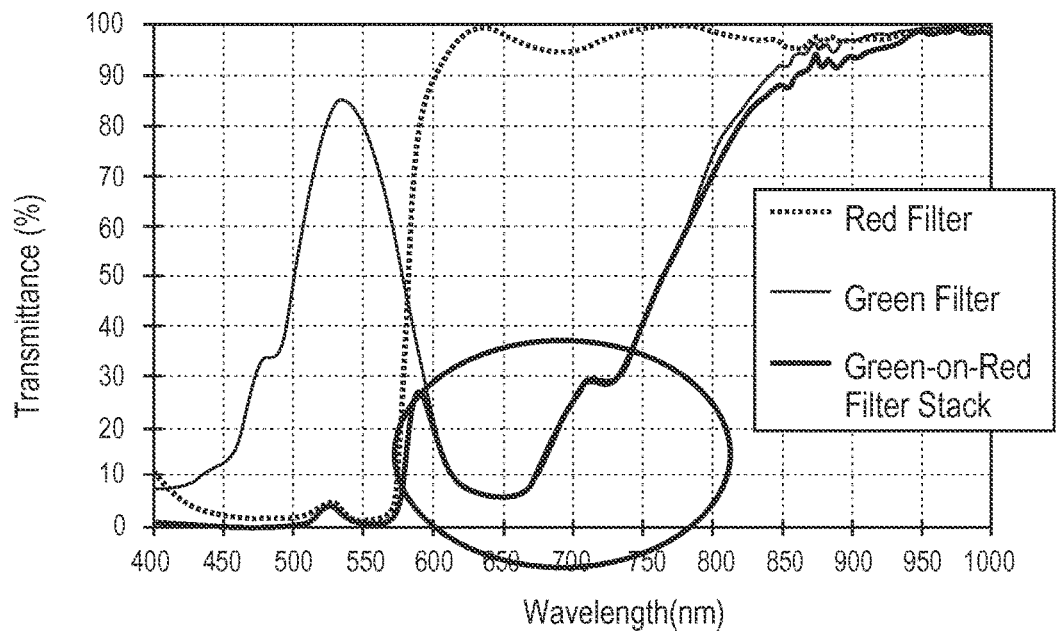

FIG. 2C is a graphical depiction of the transmittance performance (over a range of light wavelengths) of a green-on-red absorption filter stack implemented within an infrared detector system, compared with the transmittance performance of green and red absorption filters when the green and red filters are implemented individually within an infrared detector system in accordance with an exemplary embodiment of the present disclosure.

Figure 2D:
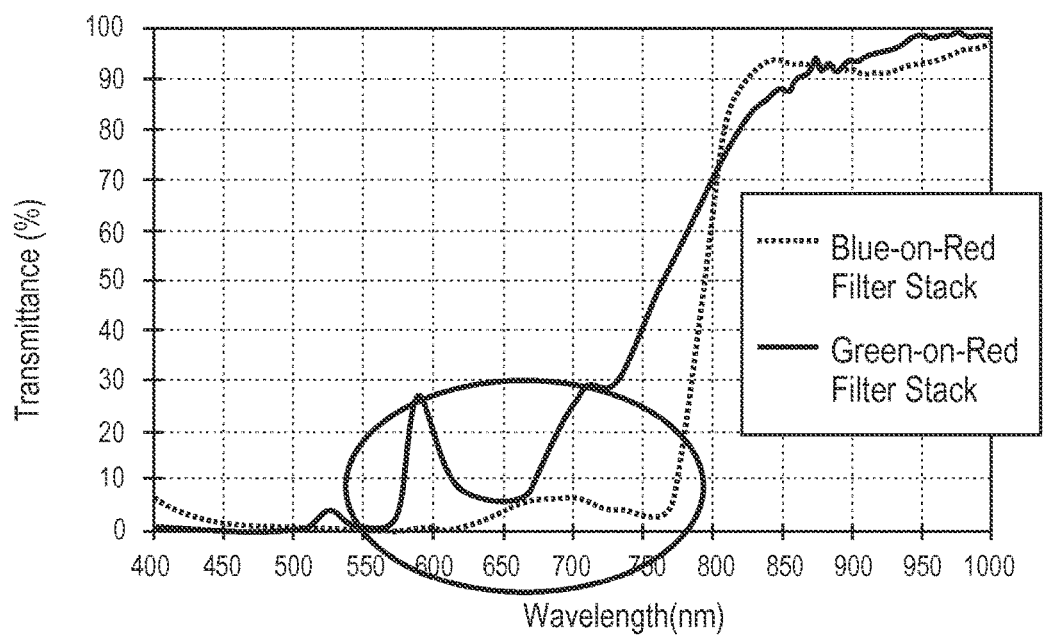

FIG. 2D is a graphical depiction of the transmittance performance (over a range of light wavelengths) of a blue-on-red absorption filter stack implemented within an infrared detection system compared with the transmittance performance of a green-on-red absorption filter stack implemented within an infrared detector system in accordance with an exemplary embodiment of the present disclosure.

Figure 3A:
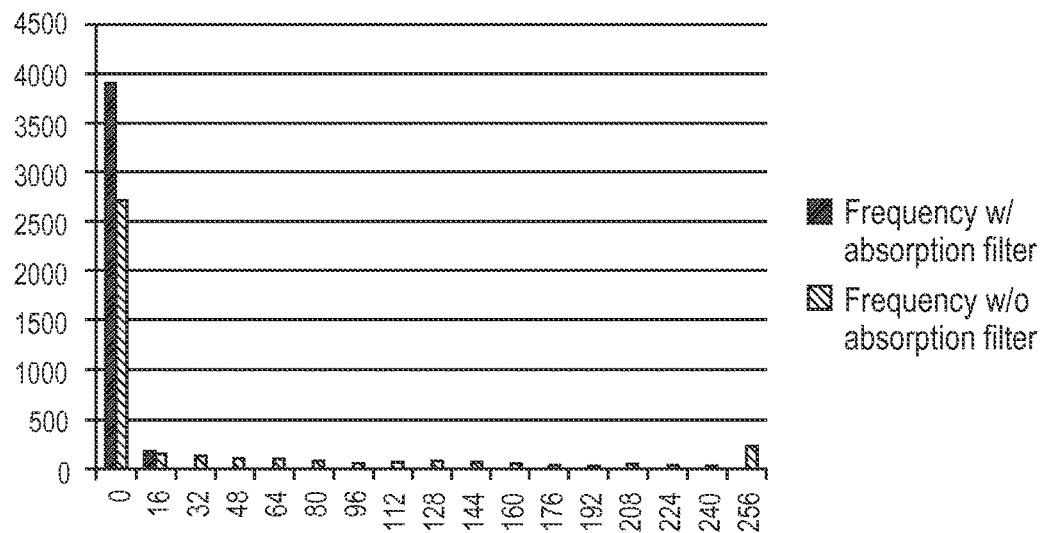
Figure 3B:
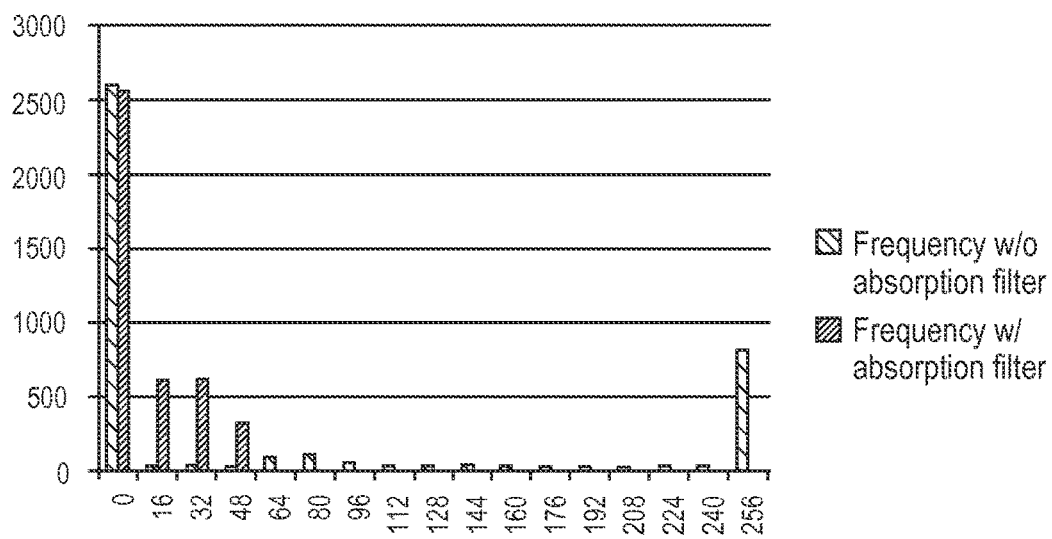

FIGS. 3A and 3B are graphical depiction of the signal-to-noise ratio (SNR) performance and frequency of a false signal with and without using optical filters in an infrared detector system at 5000 Hertz and 3000 Hertz respectively in accordance with exemplary embodiments of the present disclosure.

Figure 4A:
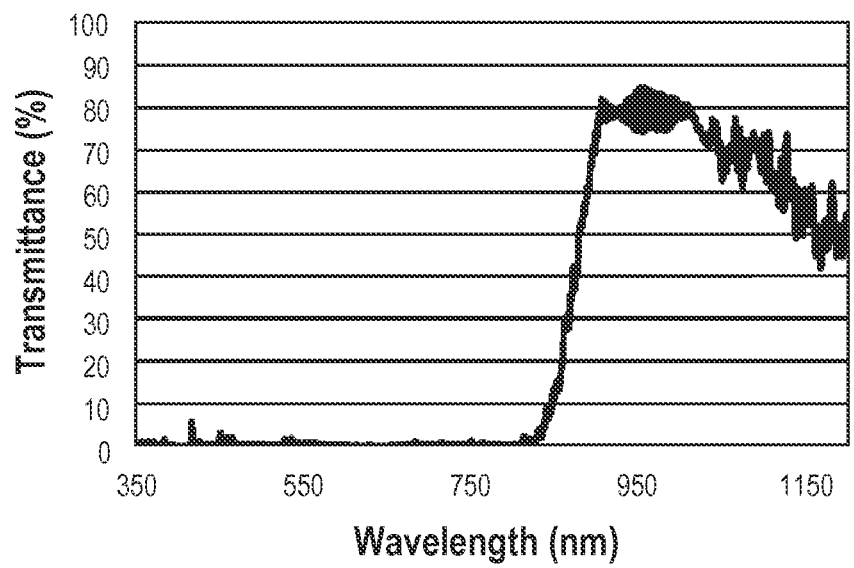
Figure 4B:
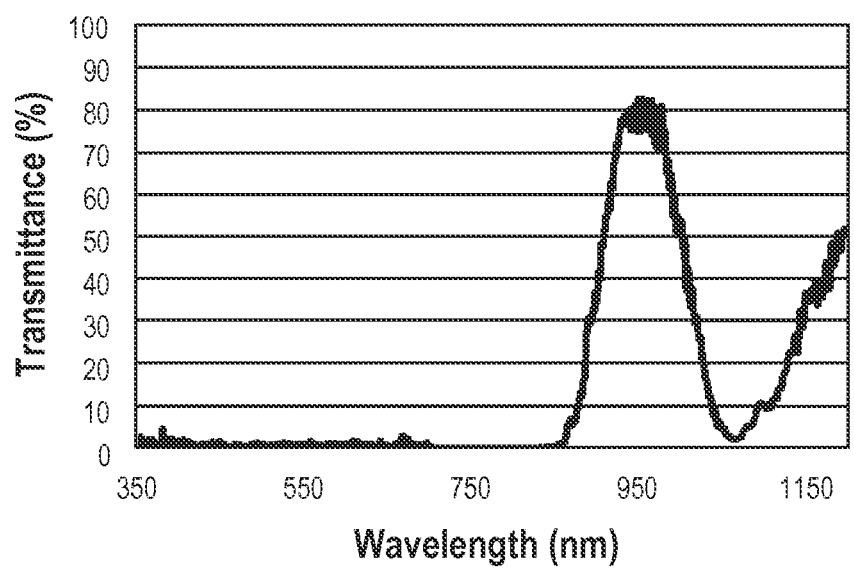

FIGS. 4A and 4B are graphical depictions of the transmittance performance of an interference filter implemented in an infrared detector system in accordance with exemplary embodiments of the present disclosure.

Figure 5:
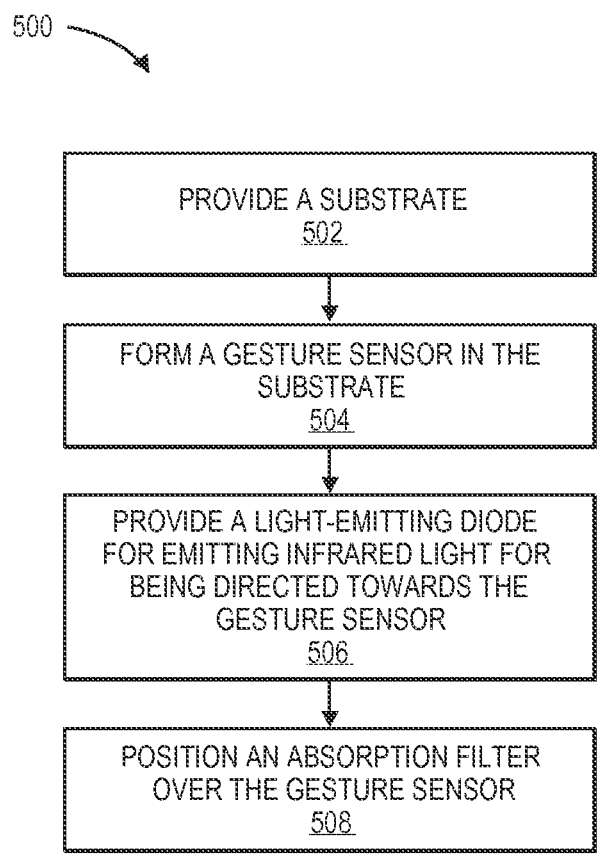

FIG. 5 is a flowchart depicting a method for fabricating an infrared detector system in accordance with an exemplary embodiment of the present disclosure.

DETAILED DESCRIPTION

Overview

An IR-based sensing device may implement an IR light emitter, such as a light-emitting diode (LED). The LED may emit infrared light and, when an object (e.g., target) is in relatively close proximity to the device, infrared light emitted from the LED may be reflected from the object and detected by a sensor of the device, thereby providing an indication that the object is in close proximity to the device. However, when visible light (e.g., ambient light) is incident on and detected by the sensor, this visible light may sometimes result in false detections by the device.

Example Implementations

Figure 1:
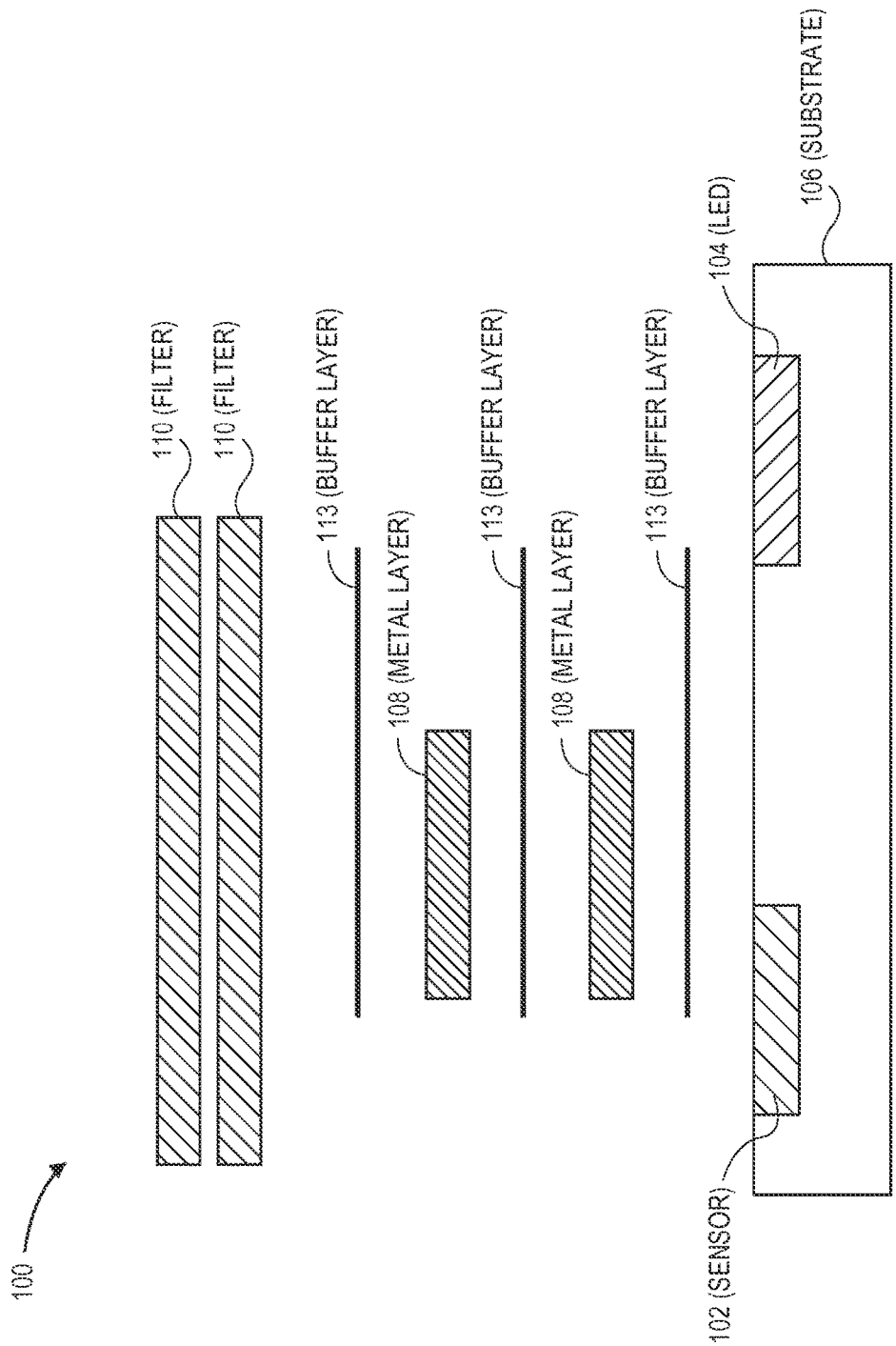
FIG. 1 is a cross-section partial exploded view of an infrared detector system in accordance with an exemplary embodiment of the present disclosure.

FIG. 1 (FIG. 1) illustrates an infrared (IR) detector system (e.g., an IR detector, an IR-based sensor, detection system) 100 in accordance with an example implementation of the present disclosure. The IR detector system 100 may be a gesture detector system (e.g., a gesture sensor, an IR-based gesture sensor, a gesture detector, a gesture device), a proximity detector system or the like.

In embodiments, the IR detector system 100 includes one or more sensor(s) (e.g., a gesture sensor, an optical sensor) 102. The sensor 102 is or includes a light detector (e.g., a photodetector, such as a photodiode, a phototransistor, or the like) and includes and/or is connected to a light detector sensing circuit. In embodiments, the sensor 102 is configured for receiving (e.g., detecting) light and providing a signal in response thereto to a control circuit (not shown) connected to the sensor 102. For example, the sensor 102 is configured for converting the received light into an electrical signal (e.g., a current or voltage) based upon the intensity of the detected light. The control circuit (e.g., processor) is configured for processing signals received from the sensor 102, storing the signals in a memory (not shown) and/or analyzing the stored signals (e.g., stored data). The memory (e.g., digital memory) is connected to the processor and configured for storing data. The memory is an example of a tangible computer-readable storage medium that provides storage functionality to store various data associated with the operation of the system 100, such as software programs and/or code segments, or other data to instruct the processor to perform the processing functionality of the processor. Processing functionality of the processor may be implemented via a software program running (e.g., executing) on the processor). In embodiments in which the system 100 is a gesture detector system, the control circuit analyzes the stored signals to determine if a gesture (and what type of gesture) has been detected. In other embodiments, the stored data may be used so that the sensor 102 operates as a proximity detector.

The sensor 102 is configured to detect light in both the visible light spectrum and the infrared light spectrum. As used herein, the term "light" is contemplated to encompass electromagnetic radiation occurring in the visible light spectrum and the infrared light spectrum. The visible light spectrum (visible light) includes electromagnetic radiation occurring in the range of wavelengths from approximately three hundred and ninety (390) nanometers to approximately seven hundred and fifty (750) nanometers. Similarly, the infrared light spectrum (infrared light) includes electromagnetic radiation that ranges in wavelength from approximately seven hundred (700) nanometers to approximately three hundred thousand (300,000) nanometers.

In embodiments, the IR detector system 100 further includes a light emitter 104. For example, the light emitter 104 is an infrared (IR) light emitter, such as a single, light-emitting diode (e.g., a 1-LED light emitter, a single IR LED) 104. In embodiments, the light emitter 104 is positioned (e.g., located) proximate to the sensor 102. The light emitter 104 includes and/or is connected to circuitry for driving the light emitter 104. In embodiments, the IR light emitter 104 is configured for emitting light rays (e.g., infrared light). In embodiments, when an object (e.g., target) is in relatively close proximity to the IR detector system 100, light rays emitted from the light emitter 104 may be reflected as light rays from the object, which may be detected by the sensor 102, thereby providing an indication that the object is in close proximity to the sensor 102. In embodiments, the system 100 may include an optical lens structure (not shown) for focusing this reflected light onto the sensor 102. In other embodiments, the IR detector system 100 may include multiple light emitters (e.g., multiple LEDs) 104. In further embodiments, the IR detector system 100 may not include any LEDs 104. Implementing a lower number of LEDs 104 in the system 100 may promote power savings for the system 100.

In embodiments, the IR detector system 100 further includes a substrate (e.g., wafer) 106. The sensor 102 and/or the light emitter 104 may be configured upon and/or formed within the substrate 106. FIG. 1 shows the light emitter 104 as being configured upon/formed within the substrate 106. However, in further embodiments, the light emitter (e.g., LED) 104 may be separate from the substrate 106. For example, when the LED 104 is separate from the substrate 106 (e.g., is a separate device), it may be co-packaged with the sensor 102 or it may be a separate device which can be wired (e.g., by a user) to a printed circuit board. The substrate 106 furnishes a base material utilized to form one or more electronic devices through various fabrication techniques such as photolithography, ion implantation, deposition, etching, and so forth. The substrate 104 may comprise n-type silicon (e.g., a silicon doped with a group carrier element, such as a group V element (e.g., phosphorus, arsenic, antimony, etc.), to furnish n-type charge carrier elements to the silicon) or p-type silicon (e.g., silicon doped with a group carrier element, such as a group MA element (e.g., boron, etc.), to furnish p-type charge carrier elements to the silicon, or other group elements to furnish p-type charge carrier elements). The substrate 106 may further be comprised of one or more insulating layers and may include a silicon dioxide layer and a silicon nitride layer. While a silicon substrate is described, it is understood that other types of substrates may be utilized without departing from the scope of this disclosure. For example, the substrate 106 may be comprised of silicon-germanium, gallium-arsenide, or the like.

In embodiments, the IR detector system 100 further includes one or more metal layers 108 (e.g., etched metal layers). In some embodiments, the metal layers 108 are configured (e.g., formed) partially over (e.g., partially overlap) the sensor 102 and are configured for facilitating attainment of desired shadowing or light directionality characteristics (e.g., to achieve a gesture response) for the system 100. In other embodiments, the metal layers 108 may not overlap the sensor 102. In embodiments, a buffer layer (e.g., a layer of polymer material such as Benzocyclobutene (BCB) polymer, or the like) 113 may be configured (e.g., formed) between the metal layer(s) 108 and the sensor 102. In embodiments in which multiple metal layers 108 are implemented, a buffer layer (e.g., BCB polymer layer) 113 may be configured (e.g., formed) between the metal layers 108.

In embodiments, the IR detector system 100 further includes one or more filters (e.g., optical filters) 110. The optical filters 110 may be configured above the sensor 102 and above the metal layers 108, such that the filters 110 are located over (e.g., at least substantially cover or overlap) the sensor (e.g., gesture sensor) 102. Thus, the filter(s) 110 are configured above the stack. The filters 110 may be engineered filters, absorption filters (e.g., absorption-based filters/films, absorptive filters, color pass filters/films), interference filters (e.g., notch filters, bandpass filters), dielectric filters and/or the like. An absorption or absorptive filter may be defined as an optical filter which selectively transmits light in a particular range of wavelengths, while absorbing light having a wavelength which is outside of the particular range of wavelengths. An interference filter may be defined as an optical filter which reflects one or more spectral bands or lines, and transmits others. Interference filters may maintain a nearly zero coefficient of absorption for all wavelengths of interest. Interference filters may be high-pass, low-pass, bandpass or band-rejection filters. Interference filters may have multiple thin layers of dielectric material having different refractive indices. A notch filter may be defined as a band-stop filter with a narrow stopband. In embodiments, the filter(s) 110 implemented may be thin film(s). In one example, a thickness for the filter 110 may be approximately 0.9 micrometers (0.9 um), however, other filter thicknesses are contemplated.

In embodiments, the filters 110 are configured for removing (e.g., absorbing, blocking out) a visible content of the light incident upon (e.g., reflected towards) the sensor 102. For example, the filters 110 may be configured for absorbing or blocking light within the visible light spectrum. Further, the filters 110 are configured for allowing an IR content of the light incident upon (e.g., reflected towards) the sensor 102 to pass through to (e.g., to be received by) the sensor 102. For example, the filters 110 may be further configured for passing light within the IR light spectrum to the sensor 102.

In embodiments in which color pass filters 110 are implemented, the filters 110 may have different colors (e.g., may be configured to transmit different colors of the visible light spectrum). For example, in one instance, a blue filter 110 may be implemented which is configured for transmitting (e.g., allowing passage through the filter of) blue visible light (e.g., light having a wavelength between approximately 450 nanometers (nm) and approximately 475 nanometers (nm)). In another instance, a green filter 110 may be implemented which is configured for transmitting green visible light (e.g., light having a wavelength between approximately 495 nanometers and approximately 570 nanometers. In another instance, a red filter 110 may be implemented which is configured for transmitting red visible light (e.g., light having a wavelength between approximately 620 nanometers and approximately 750 nanometers). It is contemplated that filters having different colors other than those mentioned above may be implemented.

In embodiments, the filters 110 may be implemented in a stack configuration, such that multiple filters 110 (e.g., two filters, each being a different color filter) are stacked together (e.g., at least partially overlap each other, are placed upon each other). Further, the stacked filters 110 (e.g., filter stack) may be located over (e.g., at least substantially cover or overlap) the sensor (e.g., gesture sensor) 102. In one or more embodiments, the filter stack may include a blue filter 110 stacked upon a red filter 110. In one or more other embodiments, the filter stack may include a green filter 110 stacked upon a red filter 110. It is contemplated that various color combinations for the filter stack other than those mentioned above may be implemented.

In embodiments, the filter(s) 110 may be configured for passing only light having specific IR wavelengths and blocking out (e.g., absorbing) other wavelengths. For example, the specific IR wavelengths may be: IR wavelengths of interest, IR wavelengths emitted by the specific LED(s) 104 used in the system 100, and/or required IR wavelengths, such as IR wavelengths necessary (e.g., required) for gesture recognition and/or proximity detection. For example, when the system 100 is a gesture detection system 100, the filters 110, by absorbing the visible light and allowing the required IR light (e.g., the longer IR light) to pass (e.g., go through), promote the reduction and/or elimination of occurrences of false detection (e.g., remove unwanted light to prevent it from interfering with gesture detection).

In embodiments, the filter(s) 110 may be formed on the wafer level, such that they are stacked upon the metal layer(s) 108. In other embodiments, the filter(s) 110 may be placed in a package (e.g., chip package, chip carrier), or placed on a glass coating. In further embodiments, a buffer (e.g., dielectric) layer (e.g., BCB polymer layer) 113 may be configured (e.g., formed) between the filter(s) 110 and the metal layer(s) 108. In embodiments, the filter(s) 110 may be patterned via any one of a number of standard patterning processes (e.g., photolithography processes). In some embodiments, the filters 110 of a filter stack may be mixed together (e.g., a red filter and blue filter of a red-on-blue filter stack configuration may be mixed together), prior to depositing them on the wafer, which may allow for having just one masking step.

FIGS. 2A through 2D (FIGS. 2A through 2D) provide graphical depictions of the transmittance performance of different filter/filter stack configurations (e.g., absorption filter/filter stack configurations) 110 when the filters/filter stack configurations 110 are implemented within the system 100. FIG. 2A depicts the individual transmittance performance (e.g., percentage of light being transmitted through the filter for given wavelengths of light) for a blue filter, a green filter, and a red filter, when they are implemented individually in the system 100. FIG. 2B depicts the transmittance performance (e.g., percentage of light being transmitted through the filter(s) for given wavelengths of light) when a filter stack configuration is being implemented and the filter stack configuration is a blue filter stacked upon a red filter. As shown in FIG. 2B, with the blue-on-red filter configuration, visible light suppression is better (e.g., more extensive) than when implementing either a red or blue filter individually. With the blue-on-red filter configuration, significant visible light suppression (e.g., less than approximately 10% transmittance) generally occurs over wavelengths ranging from approximately 400 nanometers to approximately 775 nanometers. For the blue-on-red filter stack shown in FIG. 2B, transmittance performance for transmittance of desired light wavelengths (e.g., IR wavelengths) peaks at approximately 95% transmittance. FIG. 2C depicts the transmittance performance (e.g., percentage of light being transmitted for given wavelengths of light) when the filter stack configuration being implemented is a green filter stacked upon a red filter. As shown in FIG. 2C, with the green-on-red filter configuration, visible light suppression is better than when implementing either a green or red filter individually. With the green-on-red filter configuration, significant visible light suppression (e.g., less than approximately 10% transmittance) generally occurs over wavelengths ranging from approximately 400 nanometers to approximately 575 nanometers. For the green-on-red filter stack shown in FIG. 2C, transmittance performance for transmittance of desired light wavelengths (e.g., IR wavelengths) peaks at approximately 98% transmittance. FIG. 2D depicts the transmittance performance of the green-on-red filter configuration, plotted alongside the transmittance performance of the blue-on-red filter configuration. As is shown in FIG. 2D, significant visible light suppression (e.g., less than approximately 10% transmittance) occurs over a greater range of wavelengths (e.g., is extended) when implementing the blue-on-red filter configuration, compared to when implementing the green-on-red filter configuration, however, both configurations provide good visible light suppression.

FIG. 3A and FIG. 3B (FIGS. 3A and 3B) provide graphical depictions of the signal-to-noise ratio (SNR) performance of the filters 110 when the filters 110 being implemented are absorption filters (e.g., films) as compared to systems which do not implement filters. The absorption filters 110 promote improved SNR performance by absorbing (e.g., eliminating, preventing passage of) unwanted wavelengths (e.g., visible light). FIG. 3A shows the frequency of a false signal with and without (e.g., when using and when not using) the absorption filter(s) (e.g., films) at 5000 Hertz (Hz). FIG. 3B shows the frequency of a false signal with and without absorption filter(s) (e.g., films) at 3000 Hz. As FIGS. 3A and 3B show, noise level is much lower when implementing filters compared to when not implementing filters. The SNR performance results shown in FIGS. 3A and 3B are for a green-on-red filter stack configuration. However, other combinations of different colors of filters may be implemented, such as a blue-on-red filter stack configuration.

FIG. 4A and FIG. 4B (FIGS. 4A and 4B) provide graphical depictions of the transmittance performance of the filter 110 when the filter 110 being implemented is an interference filter (e.g., broadband filter, notch filter) 110. FIGS. 4A and 4B depicts the transmittance performance (e.g., percentage of light being transmitted by the filter for given wavelengths of light) when the filter 110 being implemented in the system 100 is an interference filter. In FIG. 4B, transmittance performance peaks (e.g., at approximately 80% transmission) over a band of wavelengths ranging from approximately 850 nanometers to approximately 1050 nanometers. FIG. 4A depicts a broader response in which the signal is broadened out as compared to FIG. 4B. In FIG. 4A, transmittance performance peaks over a band of wavelengths ranging from approximately 850 nanometers to approximately 1100 nanometers. However, even when broadening out the signal, as in FIG. 4A, peak transmittance performance for the interference filter still peaks out at approximately 80% transmission. Thus, more transmission loss may be experienced when implementing interference filters compared to when implementing absorption filters.

In embodiments, the detector system(s) described herein promote improved signal-to-noise ratio by utilizing filter(s) placed above (e.g., over) the sensor(s) to prevent unwanted (e.g., visible) light wavelengths from reaching the sensor(s), thereby promoting reduction of false detection instances. In embodiments, the system 100 may be implemented in various products (e.g., electronic devices), including but not limited to, phones (e.g., mobile phones, smartphones), tablet computers (e.g., tablets), notebook computers (e.g., laptop computers), e-book readers (e.g., e-book devices, e-readers), detection systems for industrial applications, detection systems for home automation applications, or the like.

Example Fabrication Processes

FIG. 5 (FIG. 5) depicts a flowchart illustrating an example process (e.g., method) for fabricating an IR detector system (e.g., a gesture detector system), such as disclosed herein, in accordance with an exemplary embodiment of the present disclosure. In embodiments, the method 500 may include providing a substrate (Block 502). For example, the substrate may be a silicon wafer. The method 500 may further include forming a sensor in the substrate (Block 504). For example, the sensor may be a gesture sensor (Block 504).

In embodiments, the method 500 may further include providing a light emitter for emitting infrared light for being directed towards the sensor. (Block 506). For example, the light emitter may be a single-LED light emitter. The method 500 may further include positioning an optical filter over the sensor. (Block 508). For example, the optical filter may be an absorption filter. In embodiments, the step of positioning an optical filter over the sensor may include patterning the optical filter, such as via a photolithography process.

In embodiments, the method 500 may further include forming metal layer(s) between the sensor and the filter (Block 510). The method 500 may further include forming a dielectric layer between the metal layer(s) and the sensor (Block 512). The method 500 may further include forming dielectric layer(s) between the metal layer(s) (Block 514). The method 500 may further include forming a dielectric layer between the filter and the metal layer(s) (Block 516).

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. An infrared detector system, comprising:
a substrate;
an infrared light emitter formed in the substrate and configured to emit infrared light;
an infrared sensor formed in the substrate, the infrared sensor configured to detect infrared light emitted by the infrared light emitter and reflected by an object towards the infrared sensor and to provide a signal in response thereto;
a first metal layer disposed partially and directly over the infrared sensor, where the first metal layer is positioned to direct a portion of the infrared light to the infrared sensor, and wherein the first metal layer partially spans a region between the infrared sensor and the infrared light emitter;
a second metal layer disposed over the first metal layer and partially and directly over the infrared sensor, the second metal layer positioned to direct the portion of the infrared light to the infrared sensor, and wherein the second metal layer partially spans the region between the infrared sensor and the infrared light emitter;
a buffer layer including a polymer layer disposed between the first metal layer and the second metal layer, the buffer layer spanning a portion of the infrared sensor, a portion of infrared light emitter and a substantial portion of the region between the infrared sensor and the infrared light emitter; and at least one optical filter forming a filter stack and positioned over the infrared sensor, the infrared light emitter, the first metal layer, the second metal layer, and the buffer layer, the at least one optical filter spanning a substantial portion of the infrared sensor, a substantial portion of the region between the infrared sensor and the infrared light emitter, and only a portion of the infrared light emitter, and wherein the at least one optical filter is configured for preventing visible light directed towards the infrared sensor from reaching the infrared sensor, the at least one optical filter further configured for allowing only the infrared light to pass through the at least one optical filter to the infrared sensor, wherein the at least one optical filter is formed at wafer level, and wherein the filter stack comprises a red filter overlaid on a blue filter.

2. The infrared detector system as claimed in claim 1, wherein the substrate is a silicon wafer.

3. The infrared detector system as claimed in claim 1, wherein the infrared sensor is an infrared gesture sensor.

4. The infrared detector system as claimed in claim 1, wherein the optical filter is an absorption filter.

5. The infrared detector system as claimed in claim 1, wherein the optical filter includes an interference filter.

6. The infrared detector system as claimed in claim 1, wherein the infrared light emitter is an infrared light-emitting diode.

7. A gesture detector system, comprising:
a substrate;
an infrared gesture sensor formed in the substrate, the infrared gesture sensor configured to detect light directed towards the infrared gesture sensor and to provide a signal in response thereto;
an infrared light-emitting diode (LED), the infrared light-emitting diode configured for emitting infrared light towards the infrared gesture sensor;
a first metal layer disposed partially and directly over the infrared gesture sensor, where the first metal layer is positioned to direct a portion of the infrared light to the infrared gesture sensor, and wherein the first metal layer partially spans a region between the infrared sensor and the infrared LED;
a second metal layer disposed over the first metal layer and partially and directly over the infrared gesture sensor, the second metal layer positioned to direct the portion of the infrared light to the infrared sensor, and wherein the second metal layer partially spans the region between the infrared sensor and the infrared LED;
a buffer layer including a polymer layer disposed between the first metal layer and the second metal layer, the buffer layer spanning only a portion of the infrared gesture sensor and the infrared LED and substantially spanning the region between the infrared sensor and the infrared LED; and
at least one absorption filter forming a filter stack and positioned over the infrared gesture sensor, the infrared LED, the first metal layer, the second metal layer, and the buffer layer, the at least one absorption filter spanning a substantial portion of the infrared gesture sensor, a substantial portion of the region between the infrared gesture sensor and the infrared LED, and only a portion of the infrared LED, and wherein the at least one absorption filter is configured for absorbing a visible content of the light directed towards the infrared gesture sensor to block the visible content of the light from reaching the infrared gesture sensor, the at least one absorption filter further configured for allowing only the infrared light to pass through the at least one absorption filter to the infrared gesture sensor, and wherein the at least one absorption filter is formed at wafer level,
wherein the gesture detector system is a single-LED gesture detector system.

8. The gesture detector system as claimed in claim 7, wherein the at least one absorption filter includes a first absorption filter stacked upon a second absorption filter.

9. The infrared detector system as claimed in claim 1, further comprising:
a second buffer layer disposed between the first metal layer and the substrate.

10. The infrared detector system as claimed in claim 9, where the second buffer layer includes a benzocyclobutene polymer.

11. The infrared detector system as claimed in claim 9, further comprising:
a third dielectric layer, the third dielectric layer being configured between the at least one absorption filter and the second metal layer.

12. The gesture detector system as claimed in claim 8, wherein the first absorption filter includes a color pass filter that transmits light having a wavelength between approximately 450 nanometers and 475 nanometers.

13. The gesture detector system as claimed in claim 12, wherein the second absorption filter includes a color pass filter that transmits light having a wavelength between approximately 620 nanometers and 750 nanometers.

14. The gesture detector system as claimed in claim 13, wherein the blocking at least a portion of the visible content of the light from reaching the sensor includes allowing less than ten percent transmittance of light having a wavelength between approximately 400 nanometers and 775 nanometers.

15. The gesture detector system as claimed in claim 8, wherein the first absorption filter includes a blue filter and the second absorption filter includes a red filter.

16. A method for fabricating a gesture detector system, comprising:
providing a substrate;
forming an infrared gesture sensor in the substrate, the infrared gesture sensor configured to detect light including infrared light;
providing an infrared light-emitting diode (LED) for emitting infrared light for being directed towards the infrared gesture sensor;
forming two metal layers partially and directly over the infrared gesture sensor, wherein the two metal layers partially span a region between the infrared sensor and the infrared LED and where the two metal layers are positioned to direct a portion of the light including infrared light to the infrared gesture sensor and a buffer layer is disposed between the two metal layers, the buffer layer spanning only a portion of the infrared gesture sensor; and
forming a filter stack with at least one absorption filter positioned over the infrared gesture sensor, the infrared LED, the two metal layers, and the buffer layer, the filter stack spanning a substantial portion of the infrared gesture sensor, a substantial portion of the region between the infrared gesture sensor and the infrared LED, and only a portion of the infrared LED, and
wherein the at least one absorption filter is configured for absorbing visible content of light directed towards the infrared gesture sensor, the at least one absorption filter further configured for allowing only the infrared light to pass through the at least one absorption filter to the infrared gesture sensor, and wherein the at least one absorption filter is formed at wafer level and patterned using a photolithography process.

17. The method as claimed in claim 16, further comprising:
   forming a dielectric layer between a first metal layer and the infrared gesture sensor;
   forming a second dielectric layer between the first metal layer and a second metal layer; and
   forming a third dielectric layer between the absorption filter and the second metal layer.

18. The method as claimed in claim 17, wherein positioning the at least one absorption filter over the infrared gesture sensor includes positioning a first absorption layer including a green filter over a second absorption layer including a red filter.

\* \* \* \* \*